United States Patent
Janoss et al.

(10) Patent No.: US 10,550,477 B2
(45) Date of Patent: Feb. 4, 2020

(54) FATIGUE-RESISTANT COATING FOR METAL FORMING MEMBERS

(71) Applicant: IHI Ionbond AG., Olten (CH)

(72) Inventors: Bernard J. Janoss, Lake Orion, MI (US); George Savva, Windsor (CA); Christopher S. Flattery, Macomb, MI (US); Antonius Petrus Arnoldus Hurkmans, Clarkston, MI (US)

(73) Assignee: IHI Ionbond AG., Olten (CH)

( * ) Notice: Subject to any disclaimer, the term of this patent is extended or adjusted under 35 U.S.C. 154(b) by 693 days.

(21) Appl. No.: 14/434,232

(22) PCT Filed: Jun. 12, 2013

(86) PCT No.: PCT/US2013/045373
§ 371 (c)(1),
(2) Date: Apr. 8, 2015

(87) PCT Pub. No.: WO2014/065892
PCT Pub. Date: May 1, 2014

(65) Prior Publication Data
US 2015/0275370 A1 Oct. 1, 2015

Related U.S. Application Data

(60) Provisional application No. 61/716,965, filed on Oct. 22, 2012.

(51) Int. Cl.
*C23C 16/50* (2006.01)
*B21D 37/01* (2006.01)
(Continued)

(52) U.S. Cl.
CPC ............. *C23C 16/50* (2013.01); *B21D 37/00* (2013.01); *B21D 37/01* (2013.01); *C23C 16/06* (2013.01);
(Continued)

(58) Field of Classification Search
CPC . C23C 14/0641; C23C 14/5846; C23C 16/50; C23C 16/06; C23C 28/042;
(Continued)

(56) References Cited

U.S. PATENT DOCUMENTS

| | | |
|---|---|---|
| 4,943,486 A | 7/1990 | Uchiyama |
| 6,274,257 B1 | 8/2001 | Aharonov et al. |

(Continued)

FOREIGN PATENT DOCUMENTS

| | | | |
|---|---|---|---|
| CN | 101608299 B | * 12/2010 | ............. C23C 14/35 |
| EP | 1245699 A2 | 10/2002 | |

(Continued)

OTHER PUBLICATIONS

Takadoum et al.; "Friction and wear characteristics of TiN, TiCN and diamond-like carbon films"; publication date is Jan. 1997; title of journal is "Surface and Coatings Technology"; pp. 232-238.*

(Continued)

*Primary Examiner* — Edward T Tolan
(74) *Attorney, Agent, or Firm* — Dinsmore & Shohl LLP; Weston R. Gould

(57) ABSTRACT

A composite coating for a metal forming member includes a first layer disposed on said metal forming member. The first layer includes chromium nitride doped with at least one dopant such as tungsten. A second layer is disposed atop said first layer, said second layer including a lubricious material having a coefficient of friction of less than or equal to 0.2 as measured against low alloy steel.

13 Claims, 6 Drawing Sheets

(51) Int. Cl.
*B21D 37/00* (2006.01)
*C23C 16/06* (2006.01)

(52) U.S. Cl.
CPC .... *Y10T 428/265* (2015.01); *Y10T 428/31678* (2015.04)

(58) Field of Classification Search
CPC ... C23C 28/044; C23C 28/325; C23C 28/347; C23C 28/36; C23C 30/005; C23C 28/341; B21D 37/00; B21D 37/18; B21D 37/01; B21D 37/20
USPC .................................................. 428/698, 699
See application file for complete search history.

(56) References Cited

U.S. PATENT DOCUMENTS

| | | | | |
|---|---|---|---|---|
| 6,811,899 | B2* | 11/2004 | Inoue | C23C 30/005 428/698 |
| 7,879,443 | B2* | 2/2011 | Endrino | C23C 30/00 428/336 |
| 8,043,730 | B2* | 10/2011 | Kawano | C23C 14/06 428/216 |
| 8,273,469 | B2* | 9/2012 | Hoppe | C23C 14/0036 428/697 |
| 8,652,620 | B2* | 2/2014 | Fischer | C23C 30/00 428/212 |
| 9,422,618 | B2* | 8/2016 | Lyo | C23C 14/32 |
| 2005/0170162 | A1* | 8/2005 | Yamamoto | C23C 14/0036 428/216 |
| 2007/0163655 | A1 | 7/2007 | Hunter | |
| 2009/0074522 | A1* | 3/2009 | Graham | B23B 27/14 407/119 |
| 2010/0140529 | A1* | 6/2010 | Ghasripoor | C23C 28/044 251/368 |
| 2011/0192521 | A1* | 8/2011 | Ducros | B82Y 30/00 156/60 |
| 2011/0262769 | A1* | 10/2011 | Chang | C22C 19/05 428/627 |

FOREIGN PATENT DOCUMENTS

| | | | | |
|---|---|---|---|---|
| EP | 2353743 | A1 * | 8/2011 | .......... B21D 37/18 |
| JP | 2003268571 | A | 9/2003 | |
| WO | 2001030566 | A1 | 5/2001 | |
| WO | 2012104048 | A1 | 8/2012 | |

OTHER PUBLICATIONS

Translation, CN101608299, Dec. 2010.*
Benlatreche et al, "Physical and Mechanical Properties of CrAlN and CrSiN", Mar. 2009.*
Brycoat, "Chromium Nitride PVD Coating Physical Properties", retreived from internet on Sep. 19, 2018.*
International Search Report for PCT/US2013/045373 dated Aug. 24, 2013.
Examination Report/Office Action from corresponding Indian Application No. 3914/DELNP/2015 dated Apr. 9, 2018.
Roos, et al.; Thin Solid Films, 1990; vol. 193, Iss. 194; pp. 547-556.
Setsuhara et al.; Nuclear Instruments and Methods in Physics Research B, 1995; vol. 106; pp. 120-125.

* cited by examiner

Typical Wear Scar

CrN @ 1500 Cycles

CrN (200 N – 400 N)
Fatigue Cracks Beginning to Show in Coating

CrW N (200 N – 400 N)
No Cracks in Coating

CrN : (220) Orientation

CrW N : (220), (111), (200) Orientation

CrW N -TiCN - Panel V 2 - V 3 Recipe

400 N Impact load
and
400 N Sliding load

No Wear Through the TiCN Layer.
Cracking Evident at Impact Site Related to Base Material Overload.

FATIGUE-RESISTANT COATING FOR METAL FORMING MEMBERS

CROSS-REFERENCE TO RELATED APPLICATIONS

This application is the U.S. National Phase of PCT/US2013/045373 filed Jun. 12, 2013, which claims priority benefit to U.S. provisional patent application Ser. No. 61/716,965 filed Oct. 22, 2012 titled "FATIGUE-RESISTANT COATING FOR METAL FORMING MEMBERS," the subject matter of which is incorporated by reference in its entirety.

FIELD OF THE INVENTION

The present disclosure relates generally to tools and dies used in metal forming applications. More specifically, the disclosure relates to a fatigue-, wear-, and friction-resistant composite coating, and to metal forming members having that coating disposed on their surface.

BACKGROUND OF THE INVENTION

Metal forming members such as dies and the like are exposed to high cyclical pressure and high friction conditions. Recently the industry has turned to the use of advanced high strength steel alloys (AHSS) which exhibit tensile strengths far greater than those shown by previously employed steel alloys. Typical AHSS alloys manifest tensile strengths which exceed 700 MPa. In particular instances, alloys having tensile strengths in the range of 900-1200 MPa are employed in the fabrication of structural components for automobiles and the like. Owing to their high strength, AHSS steels are very difficult to form and dies used for their forming are exposed to high impact and high pressure conditions. In addition to the high impact and high pressure conditions, the surfaces of the dies experience very high frictional forces in use. These high pressure, high friction conditions can cause extreme wear to forming dies and the like, thereby greatly compromising their service life.

In some instances, the prior art has sought to harden the surfaces of the dies by various treatment processes; however, these results have produced only limited success. In other approaches, dies have been coated with various high hardness, wear resistant coatings including titanium nitride, titanium carbonitride, chromium nitride, titanium aluminum nitride, and the like. In other approaches, thermal diffusion coatings of materials such as vanadium carbide and chemical vapor deposition (CVD) coatings such as titanium carbide have been utilized. While each of these surface enhancement techniques have demonstrated success in extending the service life of dies used to form conventional alloys having strength levels below 400 MPa, they all manifest poor performance in forming operations involving AHSS alloys.

In some instances, thermal diffusion and CVD coatings have been found to extend the service life of dies used for forming AHSS alloys. However, both of these processes tend to produce changes in the dimensions of the dies resultant from changes in crystal structure during the deposition and heat treatment of commonly used tool steel die materials. The magnitude of these dimensional changes is very often outside the dimensional specifications defined by the users of the forming dies; hence, such processes are generally not acceptable. Further, thermal diffusion coatings have relatively high coefficients of friction and are incompatible with the high levels of frictional forces generated in the forming of high tensile strength AHSS materials.

While plasma vapor deposition (PVD) coatings, unlike CVD coatings and thermal diffusion coatings, do not cause unacceptable dimensional changes to the forming dies, many of such coatings have other limitations which restrict their use in high tensile strength material forming applications. Because of their columnar structure, PVD coatings such as chromium nitride, titanium aluminum nitride, and the like are susceptible to cracking when subjected to high pressure/impact conditions such as those found in the forming of materials having tensile strengths greater than 400 MPa. Some increase in die performance has been achieved by case hardening the surfaces of the dies prior to coating with conventional PVD coatings since the increased surface hardness of the die prevents deformation and cracking of the coating. But, this approach produces only limited success and is useful only in those instances where the tensile strengths of the steel alloys being formed are below 800 MPa.

As a consequence, there is a need for coatings and methods for improving the service life of metal forming members such as dies, used in connection with the shaping of AHSS alloy materials. Such coatings should be durable under very high pressure and high friction conditions encountered in the forming process and should not adversely affect the dimensional parameters of the die. In addition, processes for applying the coatings should be simple, economical, easy to implement, and recoatable. As will be explained in detail hereinbelow, the present disclosure provides a composite coating for metal forming members which achieves the foregoing goals.

SUMMARY OF THE INVENTION

The present disclosure provides for a composite coating for a metal forming member. The coating includes a first layer disposed on the metal forming member. The first layer includes chromium nitride doped with at least one dopant. A second layer is disposed atop the first layer. The second layer includes a lubricious material having a coefficient of friction of less than or equal to 0.2 as measured against low alloy steel. The dopant can be selected from the group consisting of one or more of: W, V, Ti, Zr, Co, Mo, and Ta. In an example, the dopant is W. The dopant can be present in a range of 1 to 10 atomic percent, such as a range of 3 to 7 atomic percent, and in particular instances said dopant is present in and amount 5 of approximately atomic percent. The thickness of the first layer can be in the range of 1 to 10 micrometers, such as a range of 4 to 6 micrometers. The hardness of the first layer is in the range of 2 to 5 kHV, such as 3 to 4 kHV, and in particular instances 3.6 to 3.8 kHV.

In a further example, the second layer has a coefficient of friction in the range of 0.1 to 0.15 as measured against low alloy steel. The thickness of the second layer can be in the range of 0.5 to 5 micrometers, and in particular instances 1.2 micrometers. The second layer can include at least one material selected from the group of nitrides, carbonitrides, oxides, oxynitrides, carbon based coatings, molybdenum based solid film lubricant coatings, and combinations thereof. In yet a further example, the second layer comprises TiCN.

The present disclosure further provides for a metal forming member including the composite coating of any of those described herein. The metal forming member can include a die.

The present disclosure further provides for a method of coating a metal forming member including applying the composite coating of any one of the previously described coatings thereto. At least one of the layers of the composite coating is applied by a plasma vapor deposition process. In a further example, the present disclosure provides for a method of forming a body of an advanced high strength steel. The method including the use of the metal forming member as described herein. The advanced high strength steel can have a tensile strength of at least 700 MPa, such as a strength of at least 900 MPa, and in particular instances a strength of at least 1000 MPa.

BRIEF DESCRIPTION OF THE DRAWINGS

The following detailed description may best be understood by reference to the following drawings, in which.

DETAILED DESCRIPTION

Figure 1A:
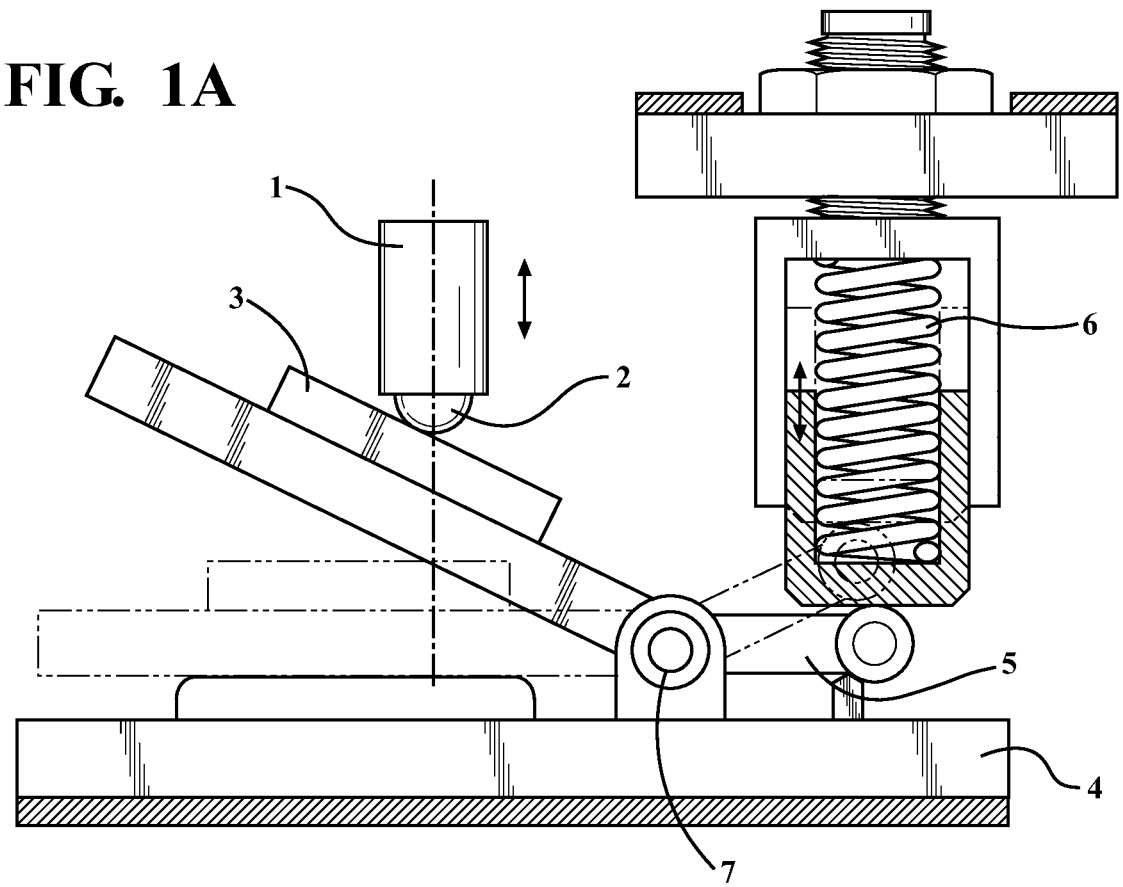
FIG. 1A illustrates an example test apparatus which was used for carrying out evaluations of impact and sliding wear of various coating materials in a rest position (rotated position shown in phantom dashed lines).

The present disclosure is directed to a composite coating for a metal forming member such as a die or the like. The coating is disposed on at least a forming surface of a metalworking member and comprises a first layer of a doped chromium nitride ceramic. Chromium nitride is a high hardness material, but the columnar nature of the basic material can cause it to manifest cracks under high pressure conditions. In accord with the present disclosure, it was found that inclusion of relatively small amounts of a dopant material, for example in a range of 1-10 atomic percent, greatly limits the formation and/or propagation of cracks through the material. While not wishing to be bound by speculation, it is presumed that the dopant material substitutes in the crystalline matrix of the chromium nitride so as to prevent the propagation of cracks therethrough. Example dopants include but are not limited to W, V, Ti, Zr, Zo, and Ta used singly or in combination. In some instances, W is employed as a dopant. As noted above, dopant levels of 1-10 atomic percent, which are consistent with substitutional doping, can be employed and, in particular instances, dopant levels fall in the range of 3-7 atomic percent, with 5 atomic percent being one particular dopant level.

In an example, the first layer of material generally has a thickness in the range of 1-10 micrometers, and in specific instances approximately 4-6 micrometers. Hardness of the first layer is typically in the range of 3000-4000 Hv, and one particular material utilized in the present disclosure comprises CrN doped with approximately 5 atomic percent W and manifests a hardness in the range of 3200-3800 Hv.

Disposed atop the first layer is a second layer which is comprised of a lubricious material. In accord with the present disclosure, it was found that this second layer should have a low coefficient of friction, typically below 0.2 against steel; and in particular instances, the second layer has a coefficient of friction in the range of 0.1-0.15. The layer of lubricious material will typically have a thickness less than that of the layer of doped chromium nitride and will generally have a thickness in the range of 0.5-5 micrometers and, in particular instances, a thickness in the range of 1-3 micrometers. A number of materials may be employed for forming the lubricious layer, and these materials may comprise nitrides, carbonitrides, oxides, oxynitrides, carbon based coatings, or molybdenum based solid film lubricant coatings and the like provided that they have a coefficient of friction which does not exceed 0.2 and is preferably below that. In an example, the specific material utilized in the present disclosure comprises TiCN, and other such materials will be readily apparent to those of skill in the art.

It was determined that the combination of the substitutionally doped chromium nitride together with a low coefficient of friction lubricious layer provides a wear-resistant coating capable of providing a relatively long service life under high impact and high friction forming conditions encountered in the use of AHSS alloy materials.

Coatings of the present disclosure may advantageously be prepared by a plasma vapor deposition (PVD) process wherein at least one, and preferably both, of the layers are formed. Such processes are cost effective and may be readily controlled to produce uniform, precise layer thicknesses on complex surfaces of metal forming dies and the like. Such PVD processes are well known in the art. In some instances the methods of the present disclosure may be combined with pre- and post-treatment processes which maximize performance of the die and coating. For example, the die material itself may be polished and/or case hardened by techniques such as nitriding, carburizing, and ferritic carburizing as is known in the art. In instances where very high tensile strength alloys are being formed, such hardening processes have been found to be advantageous. Likewise, hardening techniques are advantageously employed when the die material itself is of relatively low strength. Also, it may be advantageous in some instances to polish the coated die surface so as to further increase its galling resistance.

In the present disclosure, the combination of impact resistance, primarily from the doped chromium nitride, and a low coefficient of friction, primarily from the second layer, produces superior fatigue resistance as compared to that which would be achieved by each layer individually. As will be detailed hereinbelow, the combination of layers interacts synergistically to greatly enhance the service life of coated dies under high pressure, high friction conditions.

Experimental

The principles of the present disclosure are illustrated by a particular series of experiments and examples directed to a composite coating comprising a first, high hardness, layer of chromium nitride doped with approximately 5 atomic percent of tungsten and having a thickness in the range of 4-6 microns and a second, lubricious, layer comprised of titanium carbonitride having a thickness of approximately 1-2 microns. The overall hardness of this coating is in the range of 3600-3800 Hv and its coefficient of friction is in the range of 0.1-0.15.

Figure 1A:
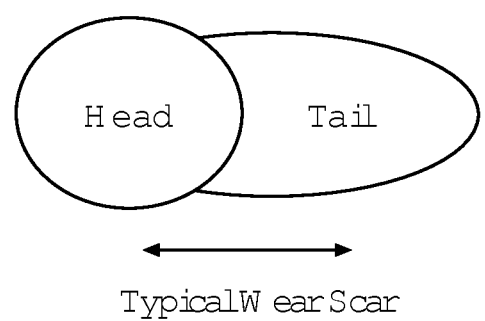
Figure 1B:
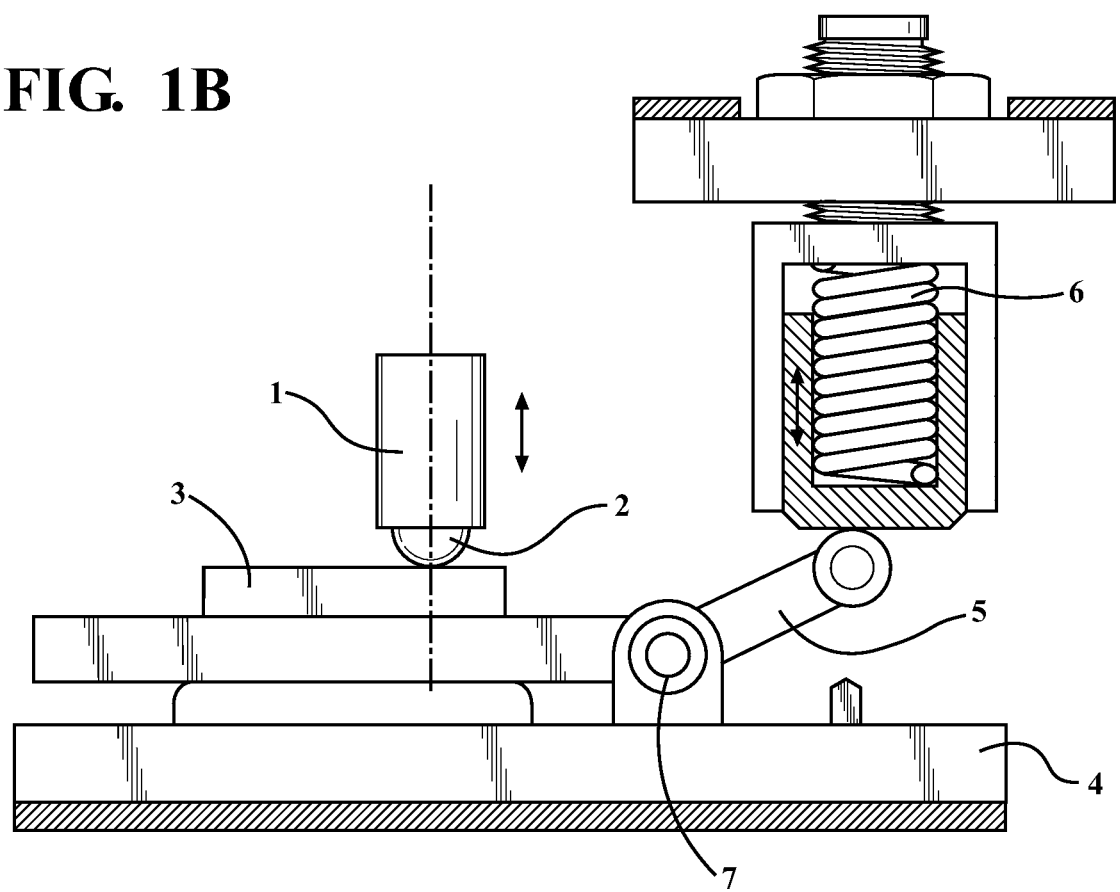
FIG. 1B illustrates the example test apparatus of FIG. 1A in a rotated position.

Referring now to FIGS. 1A-1B, there is shown a test apparatus which was used for carrying out evaluations of impact and sliding wear of various coating materials. In the apparatus, a sample 3 is impacted by a hardened carbide ball 2 driven by an air cylinder 1. The sample can be a steel tool that includes a surface coating according to the present disclosure. The sample 3 is mounted on a rotatable rocker arm 5, which supported on a rigid frame 4 through a roller bearing 7. The rocker arm 5 is biased by a return spring assembly 6 which controls the amount of force delivered to the coating on sample 3. Following initial impact of the sample by the ball, the rocker arm pivots, allowing the ball to slide along the surface coating of the specimen. The rocker arm 5 is shown at rest in FIG. 1A and rotated in FIG. 1B with the hardened ball 2 slid to a different position against the sample 3 coated surface. Dashed lines represent the movement of the objects in phantom as the rocker arm 5 rotates during impact in FIG. 1A.

As shown in FIGS. 1A-1B, a typical wear scar can represent a head to tail appearance. In these examples, testing was performed at room temperature. In an a particular example, impact load was held at 80N with a sliding load at 200N. In another example, impact load is applied between about 200-400N with a 400N sliding load.

Figure 2:
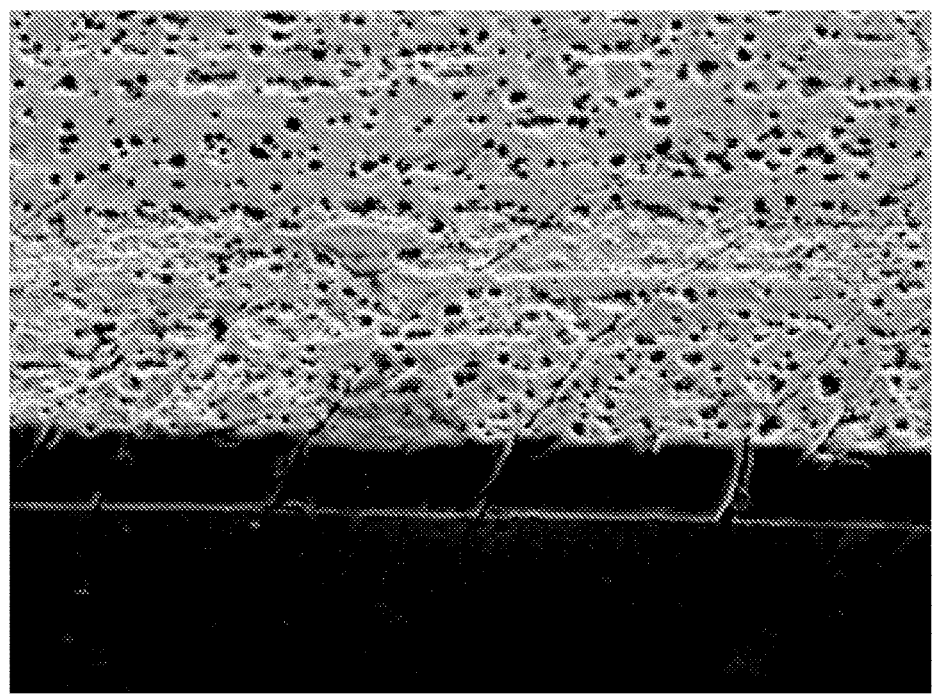
FIG. 2 illustrates a micrograph of an undoped CrN coating layer of the prior art following high pressure impact.
Figure 3:
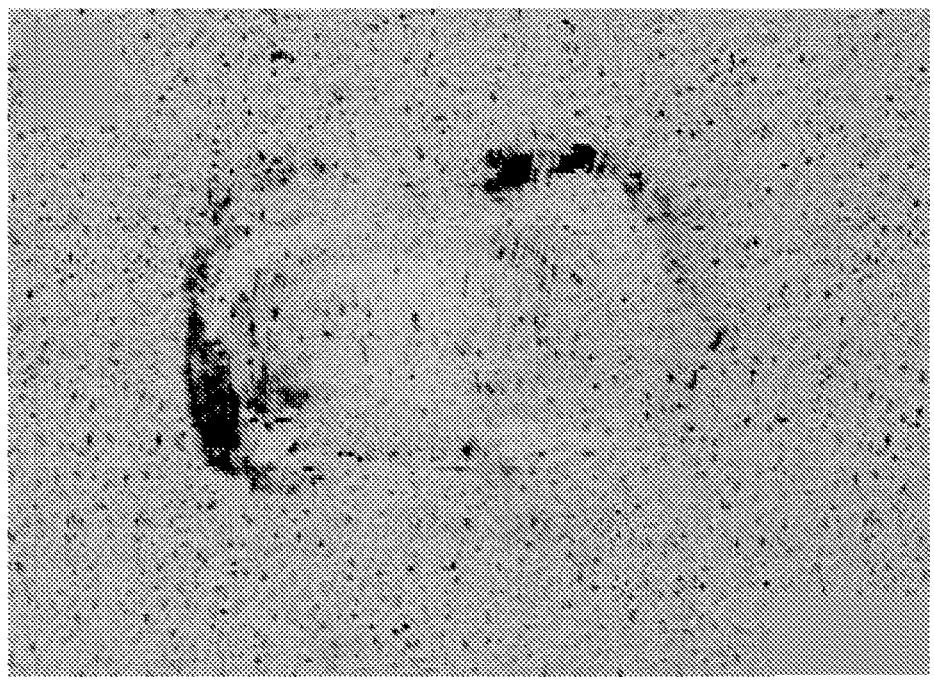
FIG. 3 illustrates a top view of the prior art CrN layer following cycling in the apparatus of FIG. 1 under conditions of a 200 N impact and 400 N sliding friction.

FIG. 2 is a micrograph of a typical undoped CrN coating layer following high pressure impact. As will be seen, following a series of approximately 1500 cycles under an impact load of 80 N and a sliding load of 200 N, a number of cracks have formed in and propagated through the CrN layer. FIG. 3 is a top view of the CrN layer following cycling in the apparatus of FIG. 1 under conditions of a 200 N impact and 400 N sliding friction. As will be seen, cracks begin to show in the coating.

Figure 4:
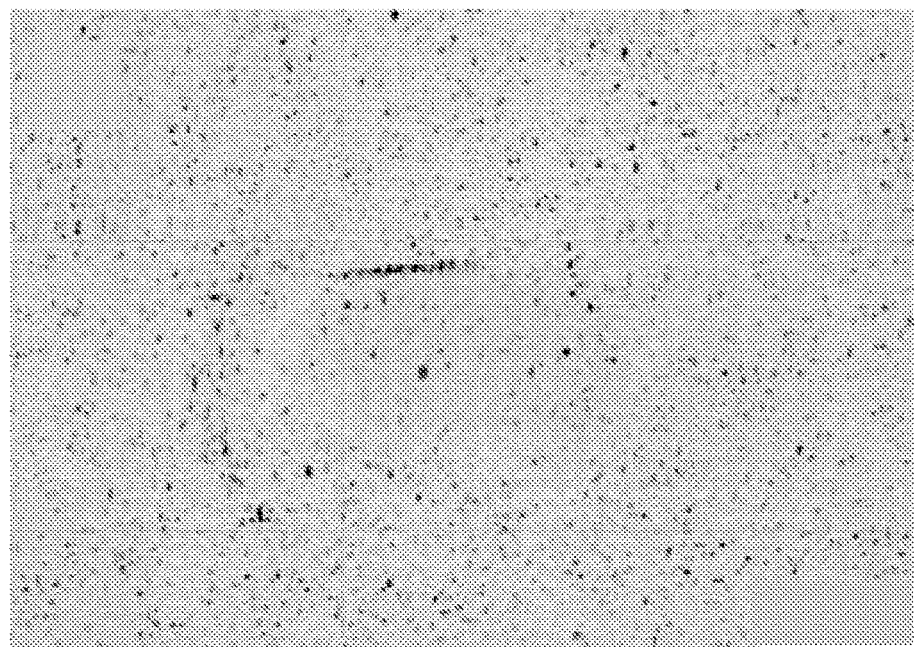
FIG. 4 illustrates a micrograph of a CrWN coating according to the present disclosure following a similar test regimen as FIG. 3.
Figure 5:
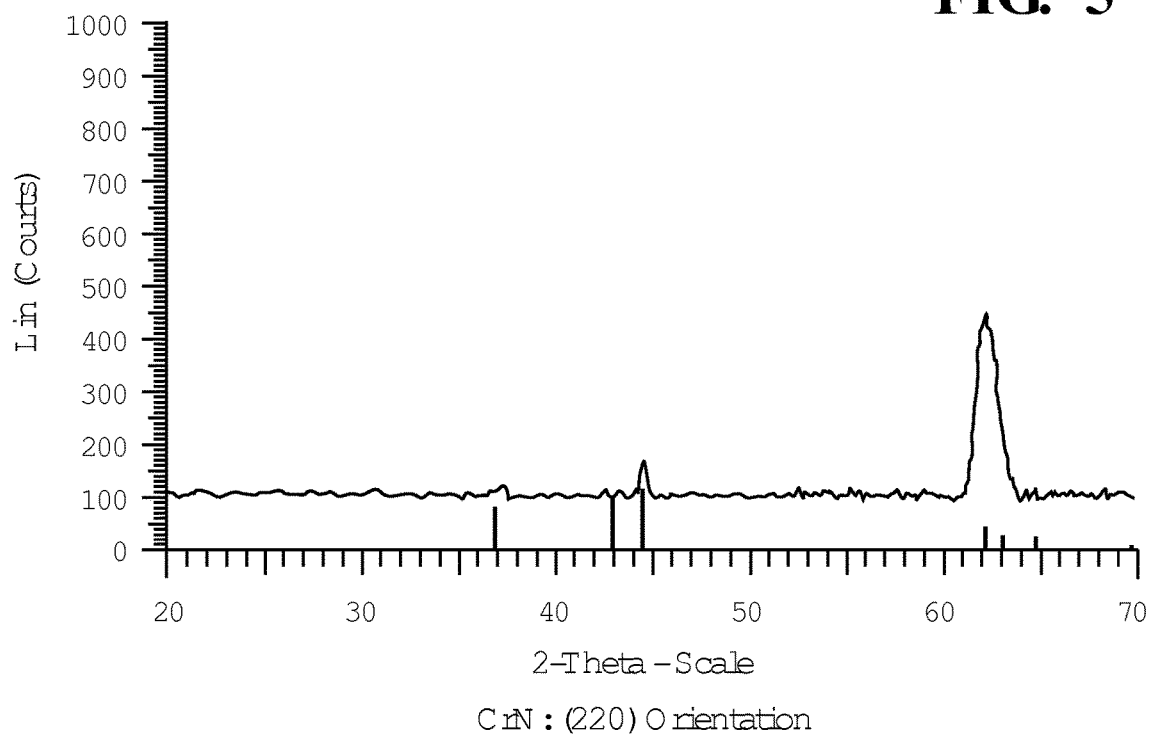
FIG. 5 illustrates x-ray diffraction data for a prior art CrN film showing a 220 crystallographic orientation.
Figure 6:
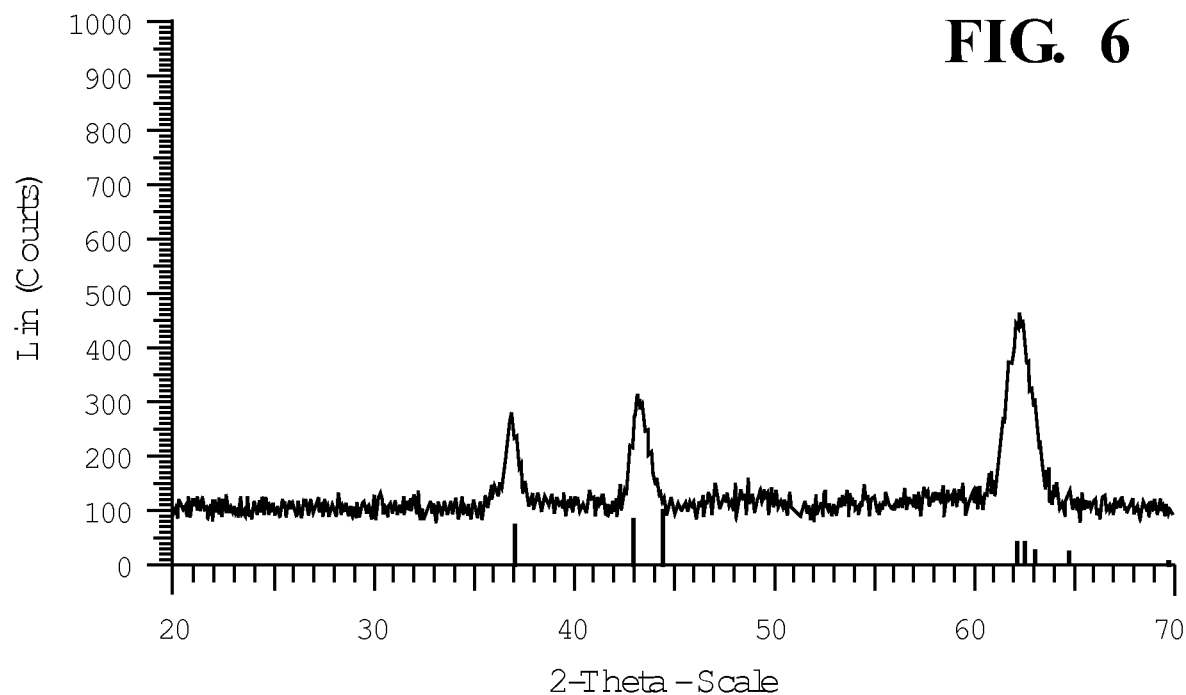
FIG. 6 illustrates x-ray diffraction data for a tungsten doped material according to the present disclosure.

FIG. 4 is a micrograph of the CrWN coating of the present disclosure following a similar test regimen, and it will be seen that this coating does not manifest any cracking. Inclusion of a substitutional dopant, in this case tungsten at 5 atomic percent, greatly enhances the crack resistance of the alloy. This is believed to be due to a change in the crystallographic orientation of the material, as will be evident from FIGS. 5 and 6. FIG. 5 shows x-ray diffraction data for a CrN film showing a 220 crystallographic orientation. FIG. 6 shows corresponding x-ray diffraction data for the tungsten doped material of the present disclosure and, as will be seen, the material manifests 220, 111, and 200 orientations. This multiple directional, noncolumnar structure is believed to be responsible for the crack resistance of the doped material of the present disclosure.

Figure 7:
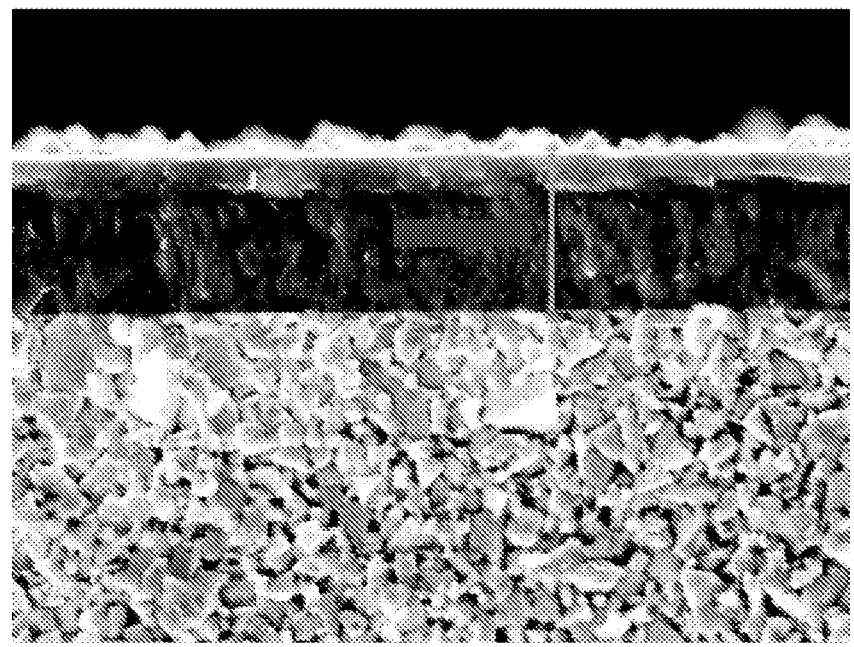
FIG. 7 illustrates a cross-sectional micrograph of an article having a composite coating of the present disclosure disposed thereupon.
Figure 8:
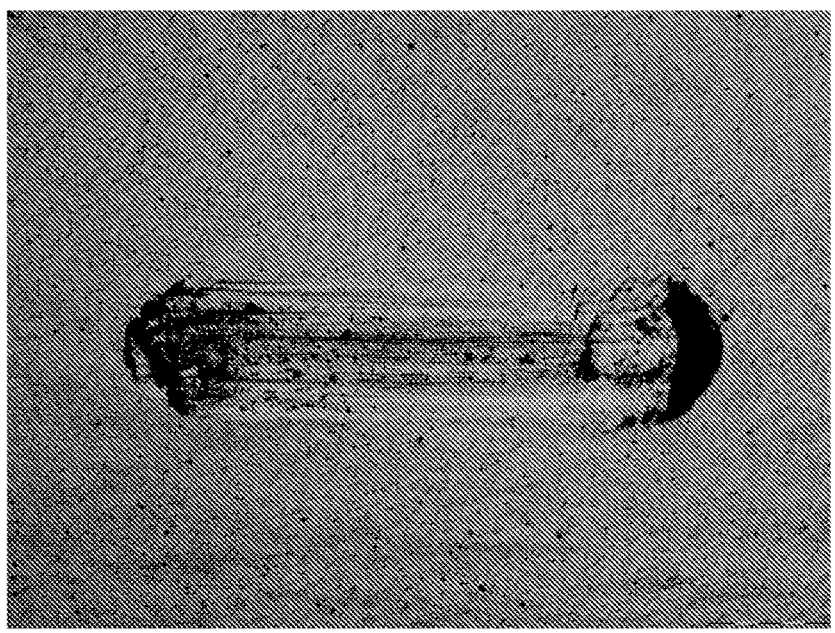
FIG. 8 illustrates a micrograph of a surface of the coated article of FIG. 7 following 1500 cycles of testing in the apparatus of FIG. 1 under a 400 N impact load and a 400 N sliding load.

In an example, a composite structure was prepared utilizing the doped chromium nitride of the present disclosure in combination with a lubricious layer of titanium carbonitride. This produced a composite structure having an overall hardness of 3600-3800 Hv and a coefficient of friction of 0.1-0.15. FIG. 7 is a cross-sectional micrograph of an article, such as a tool made of steel, having the composite coating of the present disclosure disposed thereupon. FIG. 8 is a micrograph of the surface of the coated article of FIG. 7 following 1500 cycles of testing in the apparatus of FIG. 1 under a 400 N impact load and a 400 N sliding load. As will be seen, even under these extreme conditions, no wear through of the upper lubricious layer has been seen. Some cracking is evident at the impact site, but this is related to overload and deformation of the base material which supports the coating. In the case where the base is case hardened, this cracking will not be seen. It is notable that there is no cracking seen in the remainder of the material.

As will be seen from the foregoing experimental series, the present disclosure provides a composite layer coating in which the component layers thereof interact synergistically to provide combined resistance to impact and sliding friction under very high pressure conditions which are encountered in the forming of AHSS alloy materials. As a result, use of the coatings of the present disclosure greatly prolongs service life of dies and other metal forming materials thereby minimizing equipment cost and downtime.

While the present disclosure has been described with reference to some specific embodiments, it is to be understood that other modifications and variations may be readily implemented. For example, additional high hardness and/or lubricious layers may be incorporated in the structure of the composite coatings of the present invention. Also, while the experimental series concerned some particular compositions, it is to be understood that other materials may likewise be employed in the composite coatings. The foregoing drawings, discussion, and description are illustrative of specific embodiments of the application and are not limitations upon the practice thereof. It is the following claims, including all equivalents, which define the scope of the present disclosure.

The invention claimed is:

1. A metal forming member comprising a composite coating, said coating comprising:
   a first layer disposed on a metal forming member, said first layer including chromium nitride doped with at least one dopant and wherein a hardness of said first layer is in the range of 3-4 kHV, wherein said dopant is present in a range of 1-10 atomic percent, wherein said dopant is selected from the group consisting of one or more of: W, V, Ti, Zr, Co, Mo, and Ta; and
   a second layer disposed atop said first layer, said second layer including a lubricious material having a coefficient of friction of less than or equal to 0.2 as measured against steel, wherein said lubricious material comprises at least one material selected from the group of nitrides, carbonitrides, oxides, oxynitrides, carbon, molybdenum, and combinations thereof.

2. The metal forming member of claim 1, wherein said dopant is W.

3. The metal forming member of claim 1, wherein a thickness of said first layer is in the range of 1-10 micrometers.

4. The metal forming member of claim 1, wherein said second layer has a coefficient of friction in the range of 0.1-0.15 as measured against steel.

5. The metal forming member of claim 1, wherein a thickness of said second layer is in the range of 0.5-5 micrometers.

6. The metal forming member of claim 1, wherein said second layer comprises TiCN.

7. The metal forming member of claim 1, wherein said metal forming member comprises a die.

8. The metal forming member of claim 1, wherein a thickness of said first layer is in the range of 4-6 micrometers.

9. The metal forming member of claim 1 wherein the hardness of said first layer is in the range of 3.6-3.8 kHV.

10. The metal forming member of claim 1 wherein a thickness of said second layer is 1.2 micrometers.

11. A method of forming a body of steel having a tensile strength in excess of 700 MPa, said method comprising contacting steel with the metal forming member of claim 1.

12. A method of coating a metal forming member comprising applying a composite coating thereto, the composite coating comprising:
- a first layer including chromium nitride doped with at least one dopant selected from the group consisting of one or more of: W, V, Ti, Zr, Co, Mo, and Ta, and wherein a hardness of said first layer is in the range of 3-4 kHV, wherein said dopant is present in a range of 1-10 atomic percent, the first layer applied to the metal forming member; and
- a second layer disposed atop said first layer, said second layer including a lubricious material comprising at least one material selected from the group of nitrides, carbonitrides, oxides, oxynitrides, carbon, molybdenum, and combinations thereof, and having a coefficient of friction of less than or equal to 0.2 as measured against steel.

13. The method claim 12, wherein at least one of said layers of said composite coating is applied by a plasma vapor deposition process.

\* \* \* \* \*